US007019323B2

United States Patent

Shakuda et al.

(10) Patent No.: US 7,019,323 B2
(45) Date of Patent: Mar. 28, 2006

(54) SEMICONDUCTOR LIGHT EMITTING DEVICE

(75) Inventors: Yukio Shakuda, Kyoto (JP); Yukio Matsumoto, Kyoto (JP); Nobuaki Oguro, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 133 days.

(21) Appl. No.: 10/690,580

(22) Filed: Oct. 23, 2003

(65) Prior Publication Data

US 2004/0079967 A1 Apr. 29, 2004

(30) Foreign Application Priority Data

Oct. 24, 2002 (JP) ............................ 2002-309781

(51) Int. Cl.
*H01L 29/06* (2006.01)

(52) U.S. Cl. ........................... 257/13; 257/79; 257/82; 257/98; 257/103; 257/918; 438/22; 438/24; 438/29; 438/46

(58) Field of Classification Search .......... 257/79–103, 257/13, 372, 656, 918; 438/22, 24, 25, 28, 438/29, 46, 47
See application file for complete search history.

(56) References Cited

U.S. PATENT DOCUMENTS

| | | | | |
|---|---|---|---|---|
| 5,982,546 | A * | 11/1999 | Kawamoto et al. | 359/584 |
| 6,794,690 | B1 * | 9/2004 | Uemura | 257/183 |
| 6,836,494 | B1 * | 12/2004 | Stuart | 372/39 |

FOREIGN PATENT DOCUMENTS

| | | |
|---|---|---|
| JP | 2001-339100 | 12/2001 |

* cited by examiner

*Primary Examiner*—David Nelms
*Assistant Examiner*—Long Tran
(74) *Attorney, Agent, or Firm*—Rabin & Berdo, PC

(57) ABSTRACT

A semiconductor light emitting device is formed by adhering a semiconductor layered portion having a light emitting layer forming portion to a conductive substrate via a metal layer. The metal layer has at least a first metal layer for ohmic contact with the semiconductor layered portion, a second metal layer made of Ag, and a third metal layer made of a metal which allows adhesion to the conductive substrate at a low temperature. As a result, the rate of reflection of light from the metal layer increases due to the presence of Ag in the metal layer. Further, the metal in the metal layer is prohibited from diffusing into the semiconductor layer, so that the semiconductor layer does not absorb light. And therefore the brightness of the semiconductor light emitting device can further be increased.

19 Claims, 2 Drawing Sheets

SEMICONDUCTOR LIGHT EMITTING DEVICE

FIELD OF THE INVENTION

The present invention relates to a semiconductor light emitting device employed compound semiconductor material wherein a semiconductor layered portion, having a light emitting layer forming portion is adhered to a conductive substrate via a metal layer, and in particular to a semiconductor light emitting device wherein the efficiency of emitting light has been increased.

BACKGROUND OF THE INVENTION

In a conventional semiconductor light emitting device employing InGaAlP based compound semiconductor, for example, a semiconductor layered portion 10, in which a light emitting layer forming portion 3 having a double hetero-junction structure made of InGaAlP based semiconductor material, a window layer 4 made of AlGaAs based semiconductor material, and a contact layer 5 are laminated, is deposited on a semiconductor substrate made of GaAs. And a first electrode 6 made of an Au—Be alloy, or the like, is provided on the contact layer 5, and a second electrode 7 made of an Au—Ge alloy, or the like, is provided on the rear face of the semiconductor substrate, as shown in FIG. 3.

There is a problem that most of the light emitted and advanced toward the substrate is absorbed and lost in the above structure, because GaAs of the substrate is a material that absorbs light emitted in the light emitting layer forming portion 3. Therefore, a light emitting device having the following structure has been proposed to increase an efficiency of deriving light emitted, as shown in for example, Japanese Unexamined Patent Publication 2001-339100, and attached FIG. 4. That is, the GaAs substrate is removed after the semiconductor layered portion 10, having the above described structure, is deposited on the GaAs substrate, and then a silicon substrate 1, or the like, is adhered to the semiconductor layered portion 10 via a metal layer 2 formed of an Au—Ge alloy layer 2*a*, a layer 2*b* made of Au, Al, or Ag, and an Au layer 2*c*, so that a light is reflected from an inserted metal layer 2.

The metal layer 2 is inserted on the substrate side of the light emitting layer forming portion as described above, and thereby, the light emitted in the light emitting layer forming portion and advanced toward the substrate, is reflected by the metal layer 2 so as to be emitted from the top surface effectively. This structure is considered to be useful.

As a result of research by the present inventors concerning the efficiency of deriving light in the above described structure shown in FIG. 4, however, it has been found that the increase in the efficiency of deriving light is slight in actuality, taking into consideration the time and effort needed to replace the substrate. Therefore, a further increase in the brightness is desired from the point of view of the cost efficiency.

SUMMARY OF THE INVENTION

The present invention is directed in view of the above described situation, and an object of the present invention is to provide a structure of a light emitting device in which the brightness of the semiconductor light emitting device can be further increased, the light emitting device being formed by adhering a semiconductor layered portion having a light emitting layer forming portion made of compound semiconductor, to a conductive substrate via a metal layer.

The present inventors have carried out diligent research in order to further increase the brightness in the semiconductor light emitting device having the structure wherein the conductive substrate and a semiconductor layered portion are adhered to each other, and as a result have discovered the following reasons why the brightness does not increase as expected in regard to the structure shown in FIG. 4: (1) at the time of adhesion to the conductive substrate, the semiconductor layered portion is exposed to a high temperature and mutual diffusion occurs in the junction portion between the semiconductor layered portion and the metal layer, so that it becomes easy for the semiconductor layered portion to absorb light; (2) an optimal metal having a high reflectance is not necessarily used as a metal in the second layer, and; (3) a light absorption is particularly increased by the diffusion of Au from the Au—Ge layer which acts as an ohmic contact layer with the semiconductor layered portion.

Further, it was found that the brightness can be increased to approximately twice as high as that in the conventional semiconductor light emitting device employing a GaAs substrate, by adopting the structure in which Ag is used for the metal of the second layer so as to increase its reflectance, and in addition, a third metal layer is provided so as to adhere to the conductive substrate at a low temperature so that diffusion of Au from the metal layer to the semiconductor layered portion can be prevented.

A semiconductor light emitting device according to the present invention includes; a semiconductor layered portion having a light emitting layer forming portion, a conductive substrate, and a metal layer for adhering the semiconductor layered portion to the conductive substrate, wherein the above described metal layer has at least a first metal layer for making ohmic contact with the semiconductor layered portion, a second metal layer essentially consisted of Ag, and a third metal layer made of a metal which allows to adhere to the conductive substrate and the semiconductor layered portion at a low temperature.

Here, "second metal layer essentially consisted of Ag" means that in addition to the case wherein the second metal layer is solely made of Ag, it may also include a metal containing another component (Au or Zn or the like, for example) at a ratio of 10 atomic % or less, in addition to Ag.

In this structure, the second metal layer is essentially consisted of Ag which has a high reflectance, and therefore the ratio of the light reflected from the second metal layer becomes higher than the case wherein the second metal layer is made of an Au layer or an Al layer. On the other hand, the adhesion of the semiconductor layered portion to the conductive substrate can be carried out at a low temperature so that the mutual diffusion between Au included in the first metal layer which makes contact with the semiconductor layered portion and Ga included in the semiconductor layered portion can be suppressed. This leads to the reduction in the size of the light absorption region that is formed by diffusion of Au, and thus increasing the ratio of reflected light and increasing the brightness.

Furthermore, the first metal layer may be partially removed to form a missing portion in the first metal layer. By adopting this structure the contact area between the first metal layer that includes Au and the semiconductor layered portion in which Au is easily diffusible can be reduced, so that the formation of the light absorption region is prevented further, thereby increasing the brightness.

Moreover, the formation of a protective film that prevents the diffusion of Ag in the second metal layer, and that transmits light emitted in the light emitting layer forming portion in the missing portion, is preferable, because the diffusion of Ag in the second metal layer can be prevented. Further, it is preferable that Ag is added to the first metal layer, because light can be easily reflected from the first metal layer.

It is preferable for the second metal layer to include at least, either Zn or Au at a ratio of 10 atomic % or less, because the quality of the junction with the third metal layer is enhanced without significantly lowering the reflective properties of light.

It is preferable that at least one selected from a group of In, In—Zn alloy, and Sn—Zn alloy is used for the above described third metal layer. In particular a slight inclusion of Zn is preferable, because it becomes possible to increase the quality of contact with the Ag layer, and to lower the contact resistance between the two layers. However, the temperature necessary to form the junction becomes too high in the case wherein the amount of Zn becomes too great, and therefore large increases in the amount of Zn should be avoided.

DETAILED DESCRIPTION OF THE INVENTION

Figure 1:
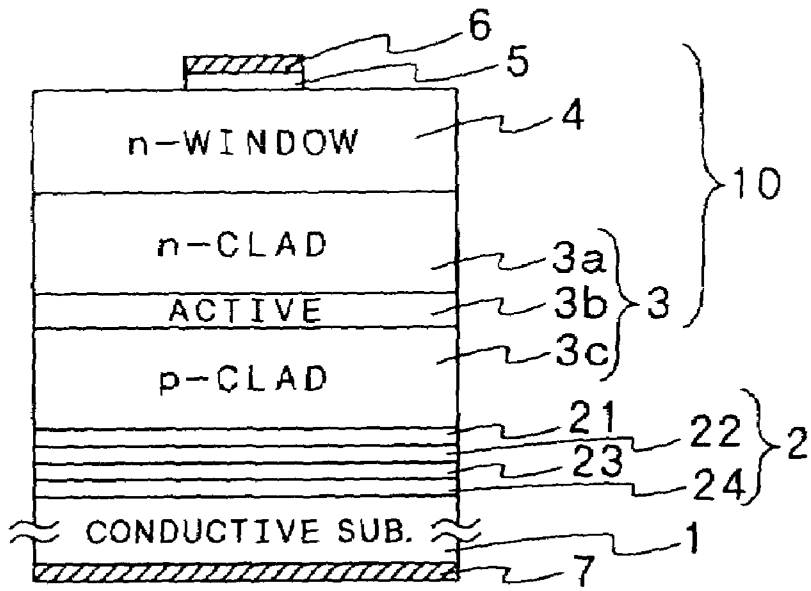
FIG. 1 is a view showing a cross sectional structure of a semiconductor light emitting device according to one embodiment of the present invention.

Next, a semiconductor light emitting device according to the present invention is described in reference to the drawings. A semiconductor light emitting device according to the present invention is formed by adhering a semiconductor layered portion 10 having a light emitting layer forming portion 3 to a conductive substrate 1 via a metal layer 2 as shown in the cross sectional structure of an LED chip in FIG. 1 which is one embodiment of the present invention. The present invention is characterized in that a metal layer 2 has at least a first metal layer 21 for making ohmic contact with the semiconductor layered portion 10, a second metal layer 22 made of Ag, and a third metal layer 23 made of a metal which allows adhesion to the conductive substrate 1 at a low temperature.

As described above, the present inventors have carried out diligent research in order to further enhance the brightness of the light emitting device, and as a result have discovered that semiconductor layered portion 10 and the metal layer 2 are exposed to a high temperature at the time when semiconductor layered portion 10 is adhered to the conductive substrate 1, and mutual diffusions occur between semiconductor layered portion 10 and the metal layer 2, thereby it leads to form a light absorption layer which lowers the brightness. Taking this point of view into consideration, the third metal layer 23 is provided, and it is made of a metal which allows to join the conductive substrate 1 and the semiconductor layered portion 10 at a low temperature. The low temperature indicates a temperature wherein mutual diffusions rarely occur between the metal layer 2 and the semiconductor layered portion 10. Concretely, In, In—Zn alloy, Sn—Zn alloy, or the like, may be selected as material for the third metal layer. It is provided to have a thickness of, for example, approximately 5 to 50 μm. The higher the ratio of Zn becomes, the higher the temperature required to melt the alloy such as In—Zn alloy, or Sn—Zn alloy becomes, and therefore the ratio of Zn is set at a value whereby the melting point of the alloy is reached at a temperature wherein the above described mutual diffusions rarely occur between the metal layer 2 and the semiconductor layered portion 10, or lower and it becomes possible to increase the quality of contact with the Ag layer and to lower the contact resistance by mixing even a slight amount of Zn into the alloy.

Figure 4:
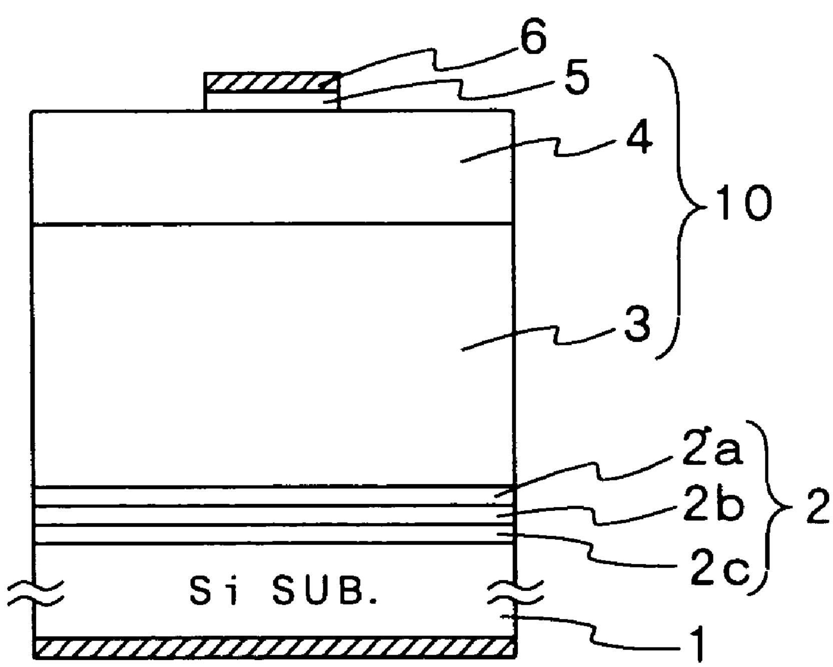
FIG. 4 is a view showing the cross sectional structure of a conventional LED chip.

Such a layer which allows a connection to be formed at a low temperature is not inserted between the semiconductor layered portion 10 and the conductive substrate 1, in the conventional structure shown in FIG. 4. However, in the present invention, the conductive substrate 1 and the semiconductor layered portion 10 are joined together using a metal for allowing a connection to be formed at a low temperature via this third metal layer 23, and therefore the temperature required for joining can be lowered. Thus, such adhesion at a low temperature can suppress diffusion of Au or Ag in the metal layer 2 into the semiconductor layered portion 10, to reduce the ratio of formation of a light absorption region in the interface between the first metal layer 21 and the semiconductor layered portion 10 due to diffusion of Au or Ag, thereby resulting in an increase in the efficiency of reflection of light.

Furthermore, the metal in the third metal layer 23, which allows to adhere at a low temperature, is compatible with Ag in the second metal layer 22, and therefore, no particular problem arises in a hetero-metal joint between the second metal layer 22 and the third metal layer 23. Here, this third metal layer 23 may also be provided on the conductive substrate 1 as opposed to on the semiconductor layered portion 10.

In addition, the present inventors have diligently carried out additional research on how to enhance the reflectance of light emitted in the light emitting layer forming portion 3, and as a result, have discovered that an Ag layer has a reflectance of approximately 96% concerning, for example, red light or infra-red light (600 nm to 800 nm) while an Au layer has a reflectance of approximately 89%, and Ag is more difficult to diffuse than Au, and that therefore usage of a layer essentially consisted of Ag as the second metal layer 22 increases the brightness, because the second metal layer 22 enhances the reflectance, and restricts the formation of a light absorption region due to reducing the diffusion of Ag from the second metal layer 22 to the semiconductor layered portion 10. Here, a layer essentially consisted of Ag indicates a layer including 90 atomic % Ag or more, and 10 atomic % or less of other components, such as Zn or Au, in addition to a layer solely made of Ag. It is preferable for the second metal layer 22 to include 10 atomic % or less of a metal other than Ag, because the second metal layer 22 is more compatible with the above described third metal layer 23 in forming a hetero-metal joint. Concretely, an Ag layer, an Ag—Zn layer, an Au—Ag layer, or the like, can be used for the second metal layer 22, and this layer may be formed to have a thickness of from approximately 0.1 to 0.5 μm.

An Au—Zn alloy or an Au—Be alloy is used for the first metal layer 21 in order to make ohmic contact with the semiconductor layered portion 10, in the case wherein the layer of semiconductor layered portion 10 that makes contact with the first metal layer 21 is of a p-type, while an Au—Ge alloy or the like is used in the case wherein the layer is of an n-type. The first metal layer 21 may have a thickness which is the minimum thickness required for forming ohmic contact with the semiconductor layered portion 10, for example, from approximately 0.05 to 1 μm; and more preferably, may have a thickness of from approximately 0.1 to 0.5 μm. This is because the light absorption layer becomes too thick to effectively utilize the first metal layer 21 in the case wherein the first metal layer 21 is too thick, as described below. In addition, it is preferable that the first metal layer 21 contains Ag having a high reflectance, because the ratio of light reflected from the first metal layer 21 increases than the case wherein the first metal layer 21 does not include Ag. Here, it becomes difficult for the first metal layer 21 to make ohmic contact with the semiconductor layered portion 10 in the case wherein the ratio of the addition of Ag is increased, and therefore it is desirable for the ratio of Ag to be at a level of approximately 50 atomic % or lower.

Furthermore, the present inventors have discovered that light absorption is particularly great in the structure shown in FIG. 4 due to the diffusion of Au in Au—Ge layer 2*a*, which is an ohmic contact layer with the semiconductor layered portion 10. That is one of the causes of reduction in the brightness of the device. That is to say, a large amount of Au diffuses from Au—Ge layer 2*a* to the semiconductor layered portion 10, as a result of heat treatment for making ohmic contact with the semiconductor layered portion 10, and at this time a light absorption region is formed in the interface between the semiconductor layered portion 10 and Au—Ge layer 2*a*. Thus, the inventors have carried out to set the first metal layer 21 at a minimum thickness sufficient to make ohmic contact, or to partially remove the first metal layer 21 as below described to solve this problem, thereby reducing the light absorption region. Accordingly, in order to reduce the diffusion of Au from the first metal layer 21, the thinner first metal layer 21 can be made to be the better.

Further, in order to further suppress the diffusion of Au from the first metal layer 21, the contact area between the first metal layer 21 and the semiconductor layered portion 10 is reduced by partially removing the first metal layer 21, and thereby the diffusion of Au from the first metal layer 21 to the semiconductor layered portion 10 can be suppressed, and the formation of the light absorption region can be restricted. Moreover, it is desirable for the missing portion to be 50% or less of the surface of the semiconductor layered portion 10, from the point of view of restricting an increase in the contact resistance resulting from the reduction of the contact area.

Figure 2:
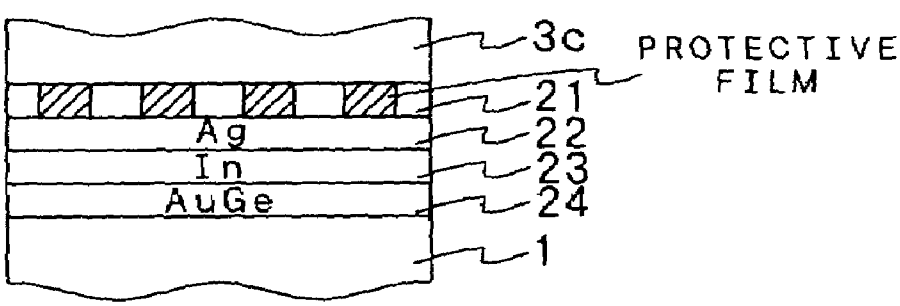
FIG. 2 is a view showing the explanatory cross sectional structure in the vicinity of the metal layer of a semiconductor light emitting device according to another embodiment of the present invention.
Figure 3:
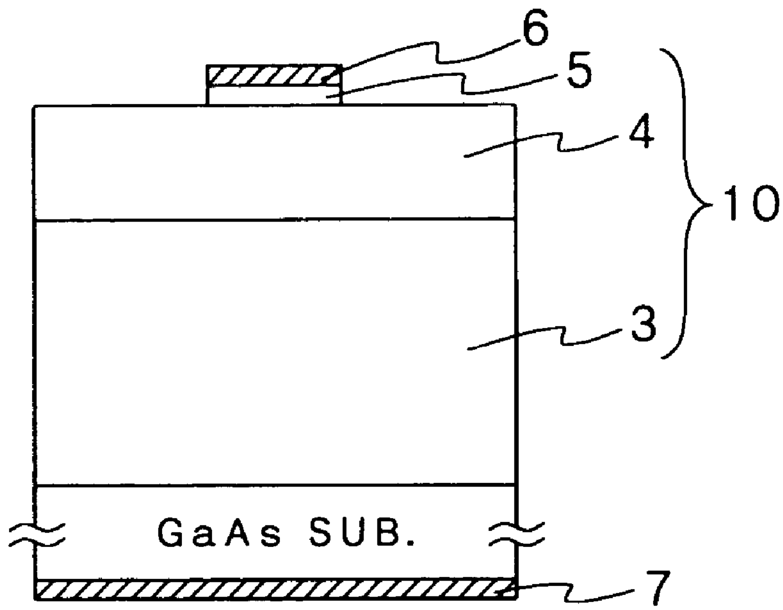
FIG. 3 is a view showing the cross sectional structure of a conventional LED chip.

Furthermore, as shown in FIG. 2, it is possible to further restrict light absorption by depositing a protective film made of a material such as $SiO_2$ into the missing portion of the first metal layer 21. That is to say, a protective film can prevent metal diffusion and block the diffusion of Ag from the second metal layer 22, while allowing light emitted in the light emitting layer forming portion 3 to pass through by using the material pass through the light such as $SiO_2$ or $Al_2O_3$ and providing in the missing portion. If such a layer is not provided, a certain amount of Ag may diffuse to the semiconductor layered portion 10 and form a light absorption region, but due to the protection film, the diffusion ratio of Ag to the semiconductor layered portion 10 would be small.

The conductive substrate 1 may be a semiconductor substrate such as a silicon substrate or a GaP substrate, or may be a metal substrate such as an Al substrate. The silicon substrate which is a semiconductor substrate is used in the example shown in FIG. 1. The silicon substrate may be either of a p-type or an n-type, and may have a carrier concentration to the extent wherein the silicon substrate is conductive so as to prevent blockage of the injection of current. In addition, it is desirable to form a high concentration region in the vicinity of the junction with a second electrode 7 or with a fourth metal layer 24, by diffusing As or B in the surface in order to make ohmic contact with the second electrode 7 or with the fourth metal layer 24. Furthermore, a GaAs substrate that absorbs light may be used, because most of the light emitted in the light emitting layer forming portion 3 and advancing toward the conductive substrate 1, is reflected from the metal layer 2.

Here, the fourth metal layer 24 in order to make ohmic contact with the semiconductor substrate and the second electrode 7 become necessary, as shown in FIG. 1, when the semiconductor substrate is used as the conductive substrate 1, while the second electrode 7 and the fourth metal layer 24 are not necessary when a metal substrate is used as the conductive substrate, because an electric terminal can be directly connected to the substrate.

The second electrode 7 is made of a material such as an Au—Zn alloy or an Au—Be alloy capable of making ohmic contact with the silicon substrate, and an Au—Ge alloy or the like is preferable in the case wherein the conductivity type of the semiconductor layered portion 10 is opposite type to that shown in FIG. 1. In addition, an Au—Zn alloy, or an Au—Be alloy is preferable for the fourth metal layer 24 in the case wherein the silicon substrate is of p-type, while an Au—Ge alloy or the like is preferable in the case wherein the silicon substrate is of n-type.

The light emitting layer forming portion 3 is formed to have a double hetero structure wherein an active layer 3*b* is sandwiched between an n-type clad layer 3*a* and a p-type clad layer 3*c*, which are made of material having band gap greater than that of the active layer 3*b* and having refractance smaller than that of the active layer 3*b*. In the example shown in FIG. 1, a p-type clad layer 3*c* is provided on the semiconductor substrate side. Here, the active layer 3*b* is not necessarily limited solely to the bulk structure, but rather may have a quantum well structure. An InGaAlP based semiconductor material is mainly used in order to obtain a red light, for example, and an AlGaAs based semiconductor material is mainly used in order to obtain infra-red light. This light emitting layer forming portion 3 are formed by materials having compositions required to obtain the desired wavelength of light emitted. That is, the mixed ratio of Al is changed, or a dopant is doped into the active layer 3*b*. The light emitting layer forming portion 3 is grown to have a required thickness.

Here, the InGaAlP based semiconductor indicates a material represented by the formula of $In_{0.49}(Ga_{1-x}Al_x)_{0.51}P$ wherein the value of x varies between 0 and 1. Here, 0.49 and 0.51, which indicate mixed crystal ratio of In and $(Al_xGa_{1-x})$, are ratios for lattice matching between the InGaAlP based material and the semiconductor substrate such as of GaAs on which the InGaAlP based semiconductor is layered. And the AlGaAs based semiconductor indicates a material represented by the formula of $Al_yGa_{1-y}As$, wherein the value of y varies between 0 and 1.

In a concrete example, the following layers are deposited in order, for example. An n-type clad layer 3*a* made of $In_{0.49}(Ga_{0.3}Al_{0.7})_{0.51}P$ doped with Se, having a carrier concentration of approximately $1\times10^{17}$ to $1\times10^{19}$ $cm^{-3}$, and having a thickness of approximately 0.1 to 2 μm; an active layer 3*b* made of $In_{0.49}(Ga_{0.8}Al_{0.2})_{0.51}P$ non-doped having a thickness of from approximately 0.1 to 2 μm; and a p-type clad layer 3*c* made of an InGaAlP based compound semiconductor having the same composition as that of the n-type clad layer 3*a* doped with Zn, having a carrier concentration of approximately $1\times10^{16}$ to $1\times10^{19}$ $cm^{-3}$, and having a thickness of approximately 0.1 to 2 μm.

On the other hand, in the case wherein an AlGaAs based compound semiconductor is used, the light emitting layer forming portion 3 is formed in a layered structure made up of an n-type clad layer 3*a* made of $Al_{0.7}Ga_{0.3}As$ doped with Se, having a carrier of concentration of approximately $1\times10^{17}$ to $1\times10_{19}$ $cm^{-3}$, and having a thickness of approximately 0.1 to 2 μm; an active layer 3*b* made of $Al_{0.2}Ga_{0.8}As$ non-doped, and having a thickness of approximately 0.1 to 2 μm; and a p-type clad layer 3*c* made of an AlGaAs based compound semiconductor having the same composition as the n-type clad layer 3*a* doped with Zn, having a carrier concentration of approximately $1\times10^{16}$ to $1\times10^{19}$ $cm^{-3}$, and having a thickness of approximately 0.1 to 2 μm.

A window layer 4 made of, for example, an n-type $Al_zGa_{1-z}As$ ($0.5\leqq z\leqq0.8$), is provided on the n-type clad layer 3*a* of the above described light emitting layer forming portion 3 with a thickness of approximately 1 to 10 μm. And in addition, a contact layer 5 made of n-type GaAs is provided on a portion of the window layer 4 with a thickness of approximately 0.1 to 1 μm. And thereby a semiconductor layered portion 10 which includes the light emitting layer forming portion 3, the window layer 4 and the contact layer 5 is formed. The window layer 4 has a function diffusing the currency to the entirety of the chip, and is made of a material having a band gap such that the window layer 4 does not absorb light.

In addition, it is preferable to make the window layer 4 as thick as possible so that light is emitted from the sides thereof. On the other hand, the contact layer 5 makes an ohmic contact with a first electrode 6, and thus contact layer 5 is unnecessary in the case wherein the window layer 4 is directly connected to the first electrode 6 with the ohmic contact. Furthermore, the first electrode 6 is formed by means of patterning on the contact layer 5 of the semiconductor layered portion 10.

Here, though not shown in the example of FIG. 1, a reflective layer (DBR; Distributed Bragg Reflector) in which two types of semiconductor layers are alternately laminated by 5 to 40 layers respectively, both types having different refractive indices, and having thicknesses of λ/(4n) (λ is the wavelength of the emitted light, and n is the refractive index of the semiconductor layer), may be inserted beneath p-type clad layer 3*c*. Thereby, a certain amount of light can be reflected from the front of the metal layer 2 by inserting the reflective layer. The reflective layer (DBR) is formed by a layered structure of layers having band gaps greater than that of the active layer 3*b*, for example, layers made of AlGaAs based semiconductor wherein the composition of Al is varied.

According to the present invention, the metal layer 2 between the semiconductor layered portion 10 and the conductive substrate 1, has a structure made up of at least: the first metal layer 21 that makes ohmic contact with the semiconductor layered portion 10; the second metal layer 22 essentially consisted of Ag; and the third metal layer 23 made of a metal that allows adhesion to the conductive substrate 1 at a low temperature; and thereby, the reflection ratio is enhanced in comparison with the case wherein the second metal layer 22 is made of an Au layer or an Al layer. On the other hand, the semiconductor layered portion 10 can be adhered to the conductive substrate 1 at a low temperature, and therefore the formation of a light absorption region is restricted. Therefore, the reflective ratio can further be enhanced, so that the brightness increases.

Furthermore, the first metal layer 21 is partially removed, and thereby the contact area between the first metal layer 21 that includes Au and the semiconductor layered portion 10 is reduced, so that further formation of a light absorption region can be prevented, and the brightness further increases.

In the manufacture of such an LED chip, an n-type GaAs substrate, for example, is placed in an MOCVD (Metal Organic Chemical Vapor Deposition) apparatus, and necessary gases of triethyl gallium (hereinafter referred to as TEG), trimethyl aluminum (hereinafter referred to as TMA), trimethyl indium (hereinafter referred to as TMIn), arsine (hereinafter referred to as $ASH_3$), phosphine (hereinafter referred to as $PH_3$), which are reactive gases, and $H_2Se$ which is an n-type dopant gas; are appropriately introduced together with hydrogen ($H_2$) which is a carrier gas, so as to carry out an epitaxial growth at a temperature from approximately 500° C. to 700° C.

And thereby the n-type contact layer 5 made of, for example, GaAs, is epitaxially grown to have a carrier concentration of approximately $1\times10^{17}$ to $1\times10^{21}$ $cm^{-3}$ of a thickness of approximately 0.1 to 1 μm, the n-type window layer 4 made of, for example, $Al_{0.7}Ga_{0.3}As$ is epitaxially grown to have a carrier concentration of approximately $1\times10^{17}$ to $1\times10^{20}$ $cm^{-3}$ of a thickness of approximately 1 to 10 μm, and the n-type clad layer 3*a* made of $In_{0.49}(Ga_{0.3}Al_{0.7})_{0.51}P$ is epitaxially grown to have a carrier concentration of approximately $1\times10^{16}$ to $1\times10^{19}$ $cm^{-3}$ of a thickness of approximately 1 μm. Next, the active layer 3*b* made of, for example, non-doped $In_{0.49}(Ga_{0.3}Al_{0.7})_{0.51}P$, is grown to have a thickness of approximately 0.5 μm. Furthermore the p-type clad layer 3*c* made of, for example, $In_{0.49}(Ga_{0.3}Al_{0.7})_{0.51}P$ is grown using the same reactive gases as those used to make the n-type clad layer 3*a*, and dimethyl zinc (DMZn) as the dopant gas to have a carrier concentration of approximately $1\times10^{17}$ to $1\times10^{19}$ $cm^{-3}$ of a thickness of approximately 1 μm.

After that, the first metal layer 21 made of an Au—Be alloy is formed on the p-type clad layer 3*c* of the semiconductor layered portion 10 by means of vacuum deposition or spattering, to have a thickness of approximately 0.05 to 1 μm, preferably, approximately 0.1 to 0.5 μm. After that a heat treatment is carried out so as to get an ohmic contact between the semiconductor layered portion 10 and the first metal layer 21.

In addition, when the first metal layer 21 is partially removed and filled $SiO_2$ or the like in the missing portion, $SiO_2$ or the like is formed on the entire surface of the substrate by means of spattering or CVD to have a thickness of approximately 0.05 to 0.2 μm, before the formation of the first metal layer 21 by means of vacuum deposition or spattering. After that, the resist is patterned in a photo-resist process, and $SiO_2$ or the like is wet-etched so that parts not covered by the resist is partially removed. After that, a metal of the first metal layer 21 is deposited on the entirety of the surface by means of vacuum deposition or spattering so as to have a thickness of approximately 0.05 to 1 μm, and after that the resist is peeled off.

After that, the second metal layer 22 made of Ag having a thickness of approximately 0.1 to 0.5 μm, and the third metal layer 23 made of In having a thickness of approximately 0.2 to 2 μm are sequentially layered by means of vacuum deposition or spattering. On the other hand, the fourth metal layer 24 made of an Au—Ge alloy is formed on the conductive substrate (silicon substrate) 1 to have a thickness of approximately 0.1 to 1 μm. The second electrode 7 made of an Au—Ge alloy is formed to have a thickness of 0.1 to 1 μm by means of vacuum deposition or spattering on the other surface of the silicon substrate 1. And a heat treatment is carried out so as to get an ohmic contact between the silicon substrate 1 and the fourth metal layer 24, as well as between the silicon substrate 1 and the second electrode 7. Thereafter, the fourth metal layer 24 side of the silicon substrate is overlapped on the third metal layer 23 side made of In of the semiconductor layered portion 10, and the connection process is carried out by applying heat in a nitrogen atmosphere to a temperature ranging from 150° C. to 300° C., more preferably a temperature of approximately 200° C.

Then the n-type GaAs substrate is removed after the connection process is completed. The removal of the GaAs substrate can be carried out by means of wet-etching, which is stopped at the time when the etching reaches to the n-type GaAs contact layer 5. Further, the layer for the first electrode 6 is deposited and patterned as shown in FIG. 1 to form the first electrode 6 made of an Au—Ge alloy having a thickness of approximately 0.1 μm to 1 μm. And then the portion of the n-type contact layer 5, which is not covered by the first electrode 6, is etched and removed using the first electrode 6 as a mask, to pattern the n-type contact layer 5, and after that the wafer is diced into chips.

According to the present invention, a semiconductor light emitting device is obtained, which is formed by adhering a semiconductor layered portion, having a light emitting layer forming portion made of compound semiconductor, to the conductive substrate, via a metal layer, and the brightness of which can further be increased. That is to say, the brightness, especially of a conventional semiconductor light emitting device using the replacement of substrate was not significantly increased in comparison with GaAs substrate, in spite of the time and effort taken to replace the substrate, while the semiconductor light emitting device of the present invention has been increased to approximately twice as much of that of the device of GaAs substrate, and has a very intensive brightness, in an adhesive structure of the conductive substrate and a semiconductor layered portion.

Although preferred examples have been described in some detail it is to be understood that certain changes can be made by those skilled in the art without departing from the spirit and scope of the invention as defined by the appended claims.

What is claimed is:

1. A semiconductor light emitting device, comprising:

a semiconductor layered portion having a light emitting layer forming portion;

a conductive substrate; and a metal layer for adhering said semiconductor layered portion to said conductive substrate, wherein said metal layer includes at least a first metal layer for making ohmic contact with said semiconductor layered portion, a second metal layer essentially consisted of Ag, and a third metal layer made of a metal which allows to adhere to said conductive substrate and said semiconductor layered portion at a low temperature;

wherein said third metal layer comprises at least one selected from a group of In, In—Zn alloy, and Sn—Zn alloy.

2. The semiconductor light emitting device according to claim 1, wherein said first metal layer is partially removed so as to form a missing portion.

3. The semiconductor light emitting device according to claim 2, wherein said missing portion occupies 50% or less of a surface area of said semiconductor layered portion.

4. The semiconductor light emitting device according to claim 2, wherein a protective film is provided in said missing portion, said protection film being a film for preventing the Ag in said second metal layer from diffusing into said semiconductor layered portion, and for transmitting light emitted in said light emitting layer forming portion.

5. The semiconductor light emitting device according to claim 4, wherein said protective film is made of $SiO_2$ or $Al_2O_3$.

6. The semiconductor light emitting device according to claim 1, wherein Ag is added to said first metal layer.

7. The semiconductor light emitting device according to claim 1, wherein said second metal layer contains at least either Zn or Au at 10 atomic % or less, and comprises Ag at 90 atomic % or greater.

8. The semiconductor light emitting device according to claim 1, wherein said second metal layer is formed to have a thickness of from 0.1 to 0.5 mm.

9. The semiconductor light emitting device according to claim 1, wherein said conductive substrate is formed of a semiconductor substrate, and a fourth metal layer for making an ohmic contact wit said semiconductor substrate is provided an a side of said metal layer, said side being contact with said semiconductor substrate.

10. The semiconductor light emitting device according to claim 9, wherein said fourth metal layer is made of at least one selected from a group of an Au—Zn alloy, an Au—Be alloy, and an Au—Ge alloy.

11. A semiconductor light emitting device, comprising:

a semiconductor layered portion having a light emitting layer forming portion;

a conductive substrate; and a metal layer for adhering said semiconductor layered portion to said conductive substrate, wherein said metal layer includes at least a first metal layer for making ohmic contact with said semiconductor layered portion, a second metal layer essentially consisted of Ag, and a third metal layer made of a metal which allows to adhere to said conductive substrate and said semiconductor layered portion at a low temperature;

wherein said first metal layer is partially removed so as to form a missing portion.

12. The semiconductor light emitting device according to claim 11, wherein said missing portion occupies 50% or less of a surface area of said semiconductor layered portion.

13. The semiconductor light emitting device according to claim 11, wherein a protective film is provided in said missing portion, said protection film being a film for preventing the Ag in said second metal layer from diffusing into said semiconductor layered portion, and for transmitting light emitted in said light emitting layer forming portion.

14. The semiconductor light emitting device according to claim 13, wherein said protective film is made of $SiO_2$ or $Al_2O_3$.

15. The semiconductor light emitting device according to claim 11, wherein Ag is added to said first metal layer.

16. The semiconductor light emitting device according to claim 11, wherein said conductive substrate is formed of a semiconductor substrate, and a fourth metal layer for making an ohmic contact with said semiconductor substrate is provided on a side of said metal layer, said side being contact with said semiconductor substrate.

17. A semiconductor light emitting device, comprising:

a semiconductor layered portion having a light emitting layer forming portion;

a conductive substrate; and a metal layer for adhering said semiconductor layered portion to said conductive substrate, wherein said metal layer includes at least a first metal layer for making ohmic contact with said semiconductor layered portion, a second metal layer essentially consisted of Ag, and a third metal layer made of a metal which allows to adhere to said conductive substrate and said semiconductor layered portion at a low temperature; and wherein Ag is added to said first metal layer.

18. The semiconductor light emitting device according to claim 17, wherein said conductive substrate is formed of a semiconductor substrate, and a fourth metal layer for making an ohmic contact with said semiconductor substrate is provided on a side of said metal layer, said side being contact with said semiconductor substrate.

19. The semiconductor light emitting device according to claim 18, wherein said fourth metal layer is made of at least one selected from a group at an Au—Zn alloy, an Au—Be alloy, and an Au—Ge alloy.

* * * * *